United States Patent [19]

Tsui

[11] Patent Number: 5,337,051

[45] Date of Patent: Aug. 9, 1994

[54] APPROXIMATE ZERO CROSSINGS FOR FREQUENCY DETERMINATION

[75] Inventor: David C. Tsui, Centerville, Ohio

[73] Assignee: The United States of America as represented by the Secretary of the Air Force, Washington, D.C.

[21] Appl. No.: 85,269

[22] Filed: Jul. 1, 1993

[51] Int. Cl.⁵ .............................................. G01S 7/36
[52] U.S. Cl. ...................................... 342/13; 342/432
[58] Field of Search ............... 342/13, 14, 16, 432, 342/492, 444

[56] References Cited

U.S. PATENT DOCUMENTS

| | | | |
|---|---|---|---|
| 4,194,206 | 3/1980 | Tsui et al. | 342/13 |
| 4,633,516 | 12/1986 | Tsui | 342/192 |
| 4,644,268 | 2/1987 | Malka et al. | 324/83 R |
| 4,914,734 | 4/1990 | Love et al. | 342/64 |
| 4,982,165 | 1/1991 | Lowenschuss | 328/140 |
| 5,049,194 | 3/1992 | Sanderson et al. | 342/14 |
| 5,128,684 | 7/1992 | Brown | 342/189 |
| 5,153,597 | 10/1992 | Hueber et al. | 342/192 |

Primary Examiner—Mark Hellner
Attorney, Agent, or Firm—Bernard E. Franz; Thomas L. Kundert

[57] ABSTRACT

The technique to measure the frequency very accurately for electronic warfare (EW) applications, and is simple in hardware, and which can accomplish this goal with a signal with real data (in contrast to complex data). It uses a linear approximation between points to calculate zero crossings of an incoming signal. From these crossings, one can find the frequency very accurately using only one channel of data. The input signal is down converted and digitized with one A/D converter. The digitized data is used to find the zero crossing. The resolution of the zero crossing is limited by the clock cycle. Two uniformly digitized points around a zero crossing are used to find the time for the crossing. The device according to the invention will calculate the frequency very accurately using only one channel of data.

This method can be used to measure the angle of arrival in a two antenna configuration with very precise results where the distance between the two antennas does not exceed half the wavelength of the incoming signal.

2 Claims, 3 Drawing Sheets

APPROXIMATE ZERO CROSSINGS FOR FREQUENCY DETERMINATION

RIGHTS OF THE GOVERNMENT

The invention described herein may be manufactured and used by or for the Government of the United States for all governmental purposes without the payment of any royalty.

CROSS REFERENCE TO RELATED APPLICATION

This is one of two applications related to measuring the frequency by using zero crossings, filed Jul. 1, 1993 (1) patent application Ser. No. 08/085,389 titled "Highly Accurate Zero Crossings for Frequency Determination" relates to a method that uses trigonometric identities to compute the location of the zero, which is very precise, but requires the use of an inverse trigonometric function. (2) patent application Ser. No. 08/085,269 titled "Approximate Zero Crossings for Frequency Determination" relates to a method using a linear approximation between points to calculate zero crossings of an incoming signal, which is simpler in hardware.

BACKGROUND OF THE INVENTION

The present invention relates generally to use of approximate zero crossings for frequency determination.

In EW applications, it is desirable to measure a signal frequency very precisely. However, the measured frequency accuracy is limited by the measurement time or pulse width. An ideal approach is to measure frequency as a function of time. The longer the pulse width is, the finer the frequency can be measured.

Frequency can be measured using phase measurement. One scheme is to use a two-channel (I and Q) down converter, a phase digitizer and a phase encoder. Data collected in this manner is complex. The frequency can be measured very accurately, if the pulse width is long.

It is known that one can measure frequency by using zero crossings. However, the accuracy is limited by the clock cycle.

The following United States patents are of interest.
U.S. Pat. No. 4,982,165 - Lowenschuss
U.S. Pat. No. 4,644,268 - Malka et al The Lowenschuss patent for a "Set-On Oscillator" to control the frequency of a jammer in an electronic warfare system, discloses a receiver having zero crossing detector means coupled to a frequency counter to determine the frequency of a received radar signal.

The Malka et al patent is for "Apparatus and Method For Determining the Magnitude and Phase of the Fundamental Component of a Complex Waveshape". So that the exact timing of the complex waveshape relative to a reference signal is established, the reference signal is applied to a zero crossing detector. The zero crossing of the reference signal drives a phase-lock loop and control logic to initiate a first digitized sample of a measurement cycle.

SUMMARY OF THE INVENTION

An objective of the invention is to provide a technique which is simple in hardware, to measure the frequency very accurately for electronic warfare (EW) applications.

In EW applications, it is desirable to measure a signal frequency very precisely. However, the measured frequency accuracy is limited by the measurement time or pulse width. An ideal approach is to measure frequency as a function of time. The longer the pulse width is, the finer the frequency can be measured. The technique according to the invention can accomplish this goal with a signal with real data (in contrast to complex data).

The invention relates to using a linear approximation between points to calculate zero crossings of an incoming signal. From these crossings, one can find the frequency very accurately using only one channel of data.

In the device according to the invention the input signal is down converted and digitized with one A/D converter. The digitized data is used to find the zero crossing. The resolution of the zero crossing is limited by the clock cycle. According to the invention, two uniformly digitized points around a zero crossing are used to find the time for the crossing. The device according to the invention will calculate the frequency very accurately using only one channel of data.

This method can be used to measure the angle of arrival in a two antenna configuration with very precise results where the distance between the two antennas does not exceed half the wavelength of the incoming signal.

While the method using trigonometric identities is more precise, the technique according to my invention is easier to implement in hardware due to lack of complex functions such as the inverse trigonometric function.

DETAILED DESCRIPTION

Figure 1:
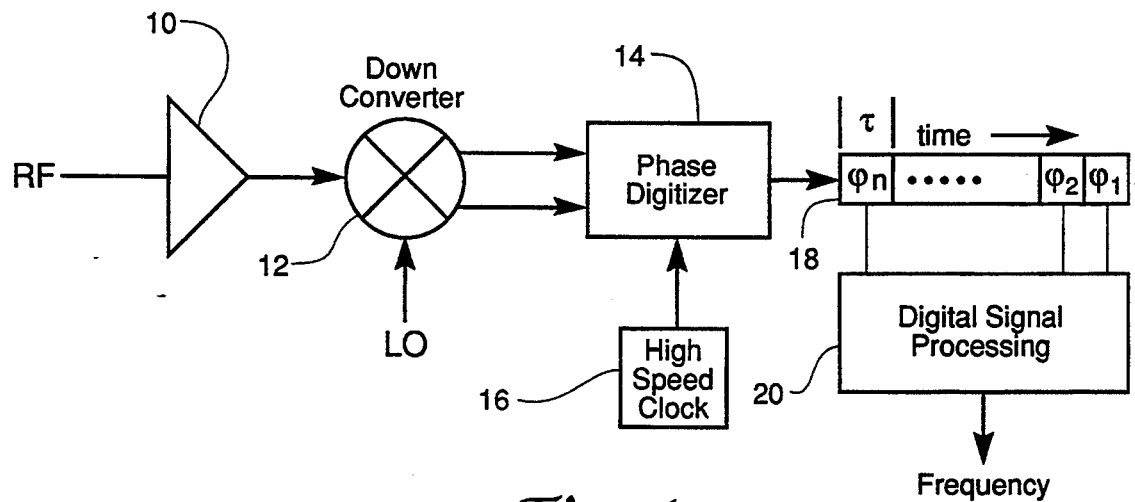
FIG. 1 is a block diagram showing a prior art digital phase sampling Instantaneous Frequency Measurement Receiver (IFM)

FIG. 1 is a block diagram of a prior art receiver by Anaren Microwave Inc., in which frequency can be measured by a scheme using phase measurement. The frequency can be measured very accurately, if the pulse width is long. The scheme is to use a two-channel (I and Q) down converter 12, and a phase encoder 18. Data collected in this manner is complex. The circuit also includes an RF amplifier 10 between the input and the converter 12, and a phase digitizer between the converter 12 and the phase encoder 18. A digital signal processing unit is used to process the data from the phase encoder 18 to provide the frequency. Very accurate frequency measurement capability can be obtained from the Anaren approach.

Invention Description

Figure 2:
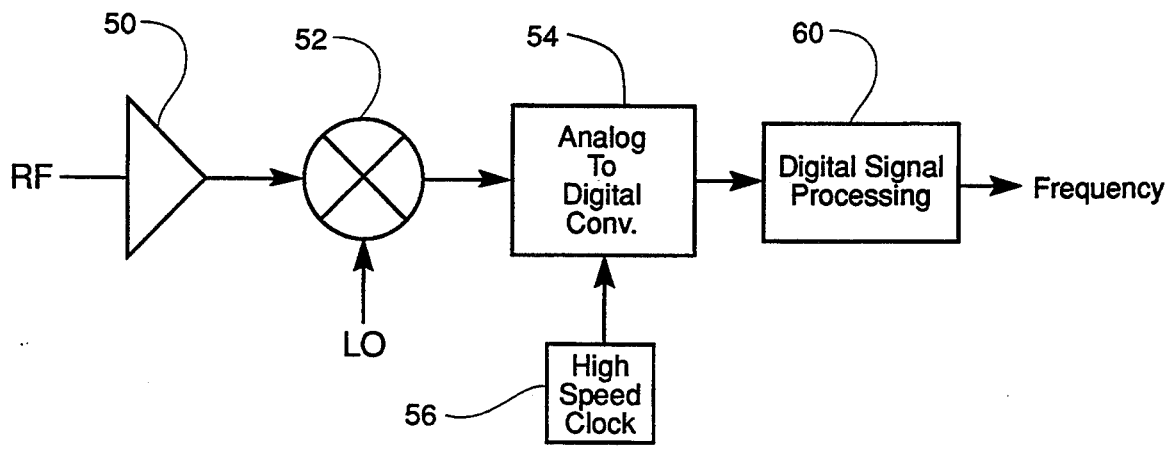
FIG. 2 is a block diagram showing a frequency measurement configuration according to the invention, using one channel and an analog-to-digital converter.

1. FIG. 2 shows the arrangement of my invention. The input signal is passed through an RF amplifier 50, is down converted in a mixer 52, is digitized with one analog-to-digital converter 54, and the digitized signal is processed in a digital signal processing unit 60. A clock 56 supplies clock signals to the converter 54. The digitized data is used to find the zero crossing. However, the resolution of the zero crossing is limited by the clock cycle. The invention is to use two uniformly digitized points around a zero crossing to find the time for the crossing. The mathematical analysis is shown as follows.

Figure 3:
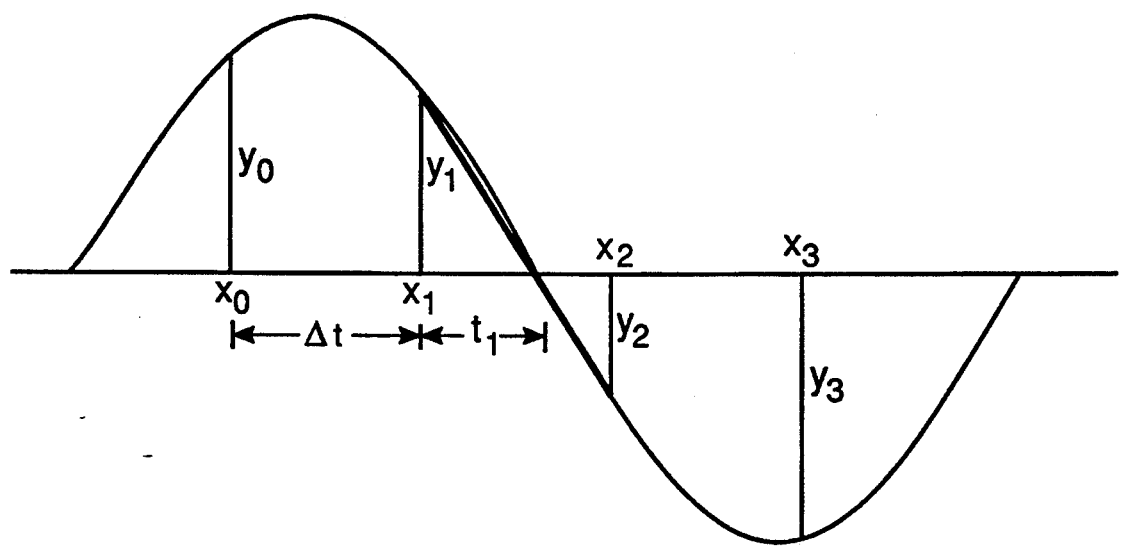
FIG. 3 is a graph showing a sampled sinusoidal waveform with linear approximation for the zero.

2. A sampled sinusoidal curve appears in FIG. 3. If we assume that the sampling frequency is at least four times that of the incoming signal, we can guarantee that two of the samples will be no more than $(\pi/2)^R$ away from a zero crossing. We see that $y_1$ and $y_2$ of FIG. 3 would be these corresponding points. We can approximate the zero crossing time by using a linear line to connect these two points. This linear line is drawn as a bold line in FIG. 3. Considering the two points to be $(x_1,y_1)$ and $(x_2,y_2)$, we can find the zero crossing by the following relationship:

$$x_{crossing} = x_1 - y_1 \left[ \frac{x_2 - x_1}{y_2 - y_1} \right] \tag{1}$$

3. Calculating successive zero crossings, we can count the number of zero crossings and then compute the frequency using the following relationship:

$$\text{frequency} = \frac{n}{2 \times \text{time difference}} \tag{2}$$

where n = number of zero crossings time difference = distance between crossings Equation (2) will calculate the frequency of a given signal to a high degree of accuracy. Thus, one can use the values obtained from the uniform sampling to find the frequency of the signal.

4. Error Found Using This Approximation: As mentioned previously, there is a requirement of sampling the signal at a minimum of four times its frequency. Using this minimum requirement, the two x-coordinates would be at x and $x+\pi/2$. Assuming $y = \cos(x)$ and that the front sampling point goes from 0 to $\pi/2$, we can compute the worst case error for this approximation. The function that would determine the distance from the zero crossing is generated from Equation (1) and the true zero crossing. The final equation is as follows:

$$f(x) = \left[ x - \cos(x) \left[ \frac{\left[x + \frac{\pi}{2}\right] - x}{\cos\left[x + \frac{\pi}{2}\right] - \cos(x)} \right] \right] - x_{zero} \tag{3}$$

$$= \left[ x - \frac{\pi}{2} \left[ \frac{\cos x}{-\sin x - \cos x} \right] \right] - x_{zero}$$

where $x_{zero}$ = the actual zero crossing.

Differentiating this function with respect to x, we arrive at $$f(x) = 1 + \frac{\pi}{2} \left[ \frac{(\sin x + \cos x)(-\sin x) - \cos x(\cos x - \sin x)}{(\sin x + \cos x)^2} \right] \tag{4}$$

$$= 1 + \frac{\pi}{2} \left[ \frac{-\sin^2 x - \cos^2 x}{(\sin x + \cos x)^2} \right]$$

$$= 1 - \frac{\pi}{2} (\sin x + \cos x)^{-2}$$

By setting this expression equal to zero, we can find the x which will produce the worst case:

$$1 - \frac{\pi}{2} (\sin x + \cos x)^{-2} = 0 \tag{5}$$

$$(\sin x + \cos x)^2 = \frac{\pi}{2}$$

$$\sin^2 x + 2 \sin x \cos x + \cos^2 x = \frac{\pi}{2}$$

$$2 \sin x \cos x + \cos x = \frac{\pi}{2} - 1$$

$$\sin 2x = \frac{\pi - 2}{2}$$

$$x = \frac{1}{2} \sin^{-1} \left[ \frac{\pi - 2}{2} \right]$$

Finding x and insuring that the inverse sine function produces an angle in Quadrant II, we find that the worst case error occurs at $x = 1.2671$ radians and $x + \pi/2 = 2.8379$ radians. These samples would produce a zero crossing at $x = 1.6419$ radians. The actual zero for the cosine wave is at 1.5708 radians. This worst case calculation produces a relative error of 4.527%.

This error is very small and with factors due to quantization and noise in the system, this approximation should work very well.

5. Results: This method measures frequency more finely as time goes on. Noise and quantization factors produce errors in the frequency calculations. However, with more and more samples, these factors diminish and the computation will converge to the true frequency.

Figure 4:
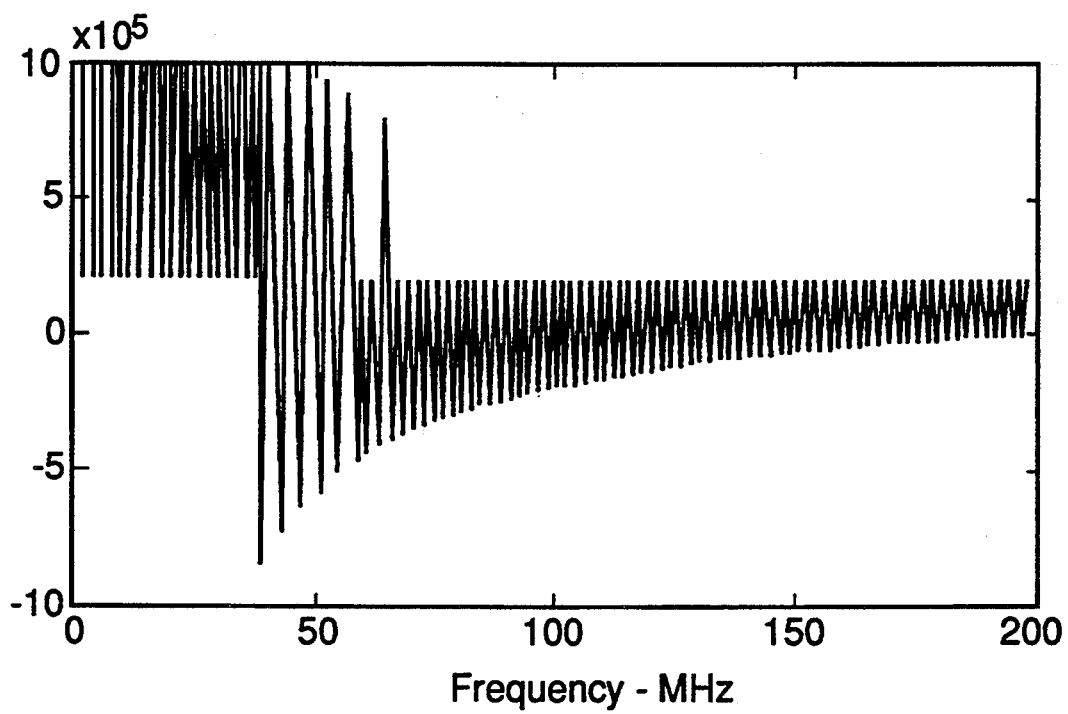
FIG. 4 is a graph showing error results without using the method of the invention.

Experimental data was collected from a signal generator for a 200 MHz signal. In FIG. 4, one can view the error difference between the actual frequency of 200 MHz and a simplified calculation of the zero crossings. The method to produce the calculations for FIG. 4 was to use the sampled point that was closest to zero and there was no compensation for this sampled point. One can see this error is on the order of 1 MHz.

Figure 5:
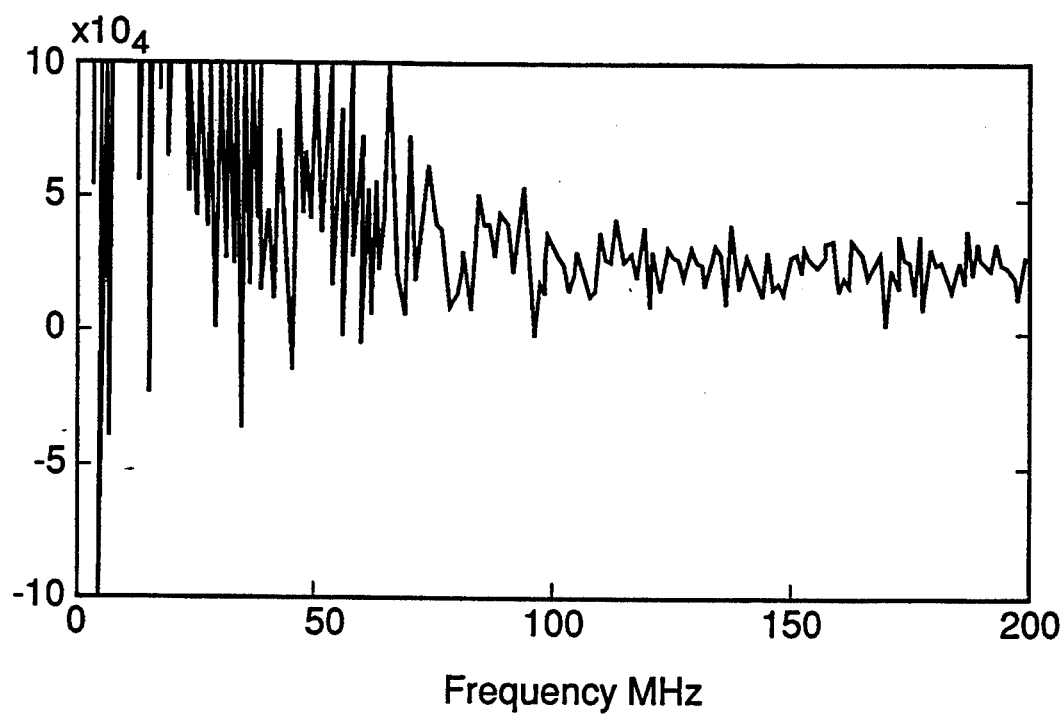
FIG. 5 is a graph showing error results using the method of the invention.

In FIG. 5, one can see the error results against the same 200 MHz, but using the invention described in this specification. The error using this algorithm is roughly one magnitude order less, and the convergence to the final solution is quicker.

Figure 6:
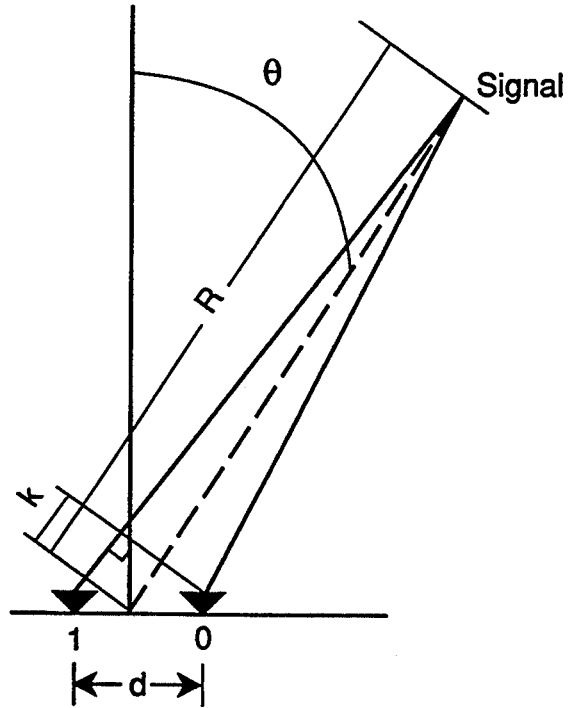
FIG. 6 is a diagram showing a two antenna configuration for measuring angle of arrival, using the method according to the invention.

6. Angle of Arrival: Another use of this algorithm is to measure the angle of arrival of an incoming signal. Two antennas configured as in FIG. 6 can accomplish this task. For a signal that is a very far distance away, it is possible to compute the angle of arrival by calculating the time difference that it takes the signal to be received by both antennas. We calculate the time difference by computing the time it takes for zero crossings to arrive at both antennas. Knowing this difference, we can compute the angle $\theta$ from the following equations:

$$k = \text{time difference} \times c \tag{6}$$

where k = lag distance $$c = \text{speed of light}(3 \times 10^8 \text{ m/s}) \tag{7}$$
$$k = d \times \sin \theta$$

where
d = distance between the two antennas
$\theta$ = angle of arrival

Thus, the angle of arrival can be calculated as such, $$\theta = \sin^{-1}\left[\frac{k}{d}\right] \tag{8}$$

However, for this calculation to work properly, the distance between the two antennas cannot exceed half the wavelength of the incoming signal. If it does, it is not possible to discern which quadrant the angle lies in from the inverse sine function.

7. Conclusions: The invention described above will calculate the frequency very accurately using only one channel of data. This method will be easier to implement in hardware than the existing Anaren approach. The convergence from this method is relatively quick. Additionally, this method can be used to measure the angle of arrival in a two-antenna configuration with very precise results.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A frequency measurement receiver comprising input means coupling a source of input signals to a single analog-to-digital converter operated at a sampling frequency which is at least four times the frequency of the input signals to provide a set of digitized samples at points (x,y), where x represents time and y represents the digitized value of the amplitude;

means for selecting two of said samples at points designated $(x_1,y_1)$ and $(x_2,y_2)$ each of which is not more than $\pi/2$ radians away from a selected zero crossing, means for finding a zero crossing along a linear line between the two points using the relationship:

$$x_{crossing} = x_1 - y_1 \left[\frac{x_2 - x_1}{y_2 - y_1}\right]$$

means for calculating successive zero crossings, counting the number of zero crossings and then computing a value for the frequency of the input signals using the relationship:

$$\text{frequency} = \frac{n}{2 \times \text{time difference}}$$

where
n = number of zero crossings
time difference = distance between the first of the n crossings and last of the n crossings.

2. Apparatus for measuring an angle of arrival $\theta$ of an incoming signal using first and second antennas separated by a distance d coupled to receiver means;

said receiver means comprising input means coupling input signals from the first and second antennas to analog-to-digital converter means to provide a first set of digitized samples at points (x,y) for signals received via the first antenna, and a second set of digitized samples at points (x,y) for signals received via the second antenna, where x represents time and y represents the digitized value of the amplitude;

means for selecting two of said samples from the first set of digitized signals at points designated $(x_1,y_1)$ and $(x_2,y_2)$ each of which is not more than $\pi/2$ radians away from a selected zero crossing, means for finding a value for a zero crossing along a linear line between the two points $(x_1,y_1)$ and $(x_2,y_2)$ using the relationship:

$$x_{crossing-1} = x_1 - y_1 \left[\frac{x_2 - x_1}{y_2 - y_1}\right]$$

means for selecting two of said samples from the second set of digitized signals at points designated $(x_3,y_3)$ and $(x_4,y_4)$ each of which is not more than $\pi/2$ radians away from a selected zero crossing, means for finding a value for a zero crossing along a linear line between the two points $(x_3,y_3)$ and $(x_4,y_4)$ using the relationship:

$$x_{crossing-2} = x_3 - y_3 \left[\frac{x_4 - x_3}{y_4 - y_3}\right]$$

means for calculating the time difference that it takes the signal to be received by both of said antennas as the difference between the values $x_{crossing-1}$ and $x_{crossing-2}$, and means for calculating a lag distance k from the following equation:
k = time difference $\times$ c
where c = speed of light($3 \times 10^8$ m/s)
and means for calculating the angle of arrival as $$\theta = \sin^{-1}\left[\frac{k}{d}\right].$$

* * * * *